United States Patent
Lee et al.

(10) Patent No.: US 9,076,697 B2
(45) Date of Patent: Jul. 7, 2015

(54) PHOTORESIST COMPOSITION, METHOD OF MANUFACTURING A POLARIZER AND METHOD OF MANUFACTURING A DISPLAY SUBSTRATE USING THE SAME

(71) Applicant: SAMSUNG DISPLAY CO., LTD., Yongin, Gyeonggi-Do (KR)

(72) Inventors: Ki-Beom Lee, Seoul (KR); Dae-Hwan Jang, Gwangmyeong-si (KR); Atsushi Takakuwa, Hwaseong-si (KR)

(73) Assignee: SAMSUNG DISPLAY CO., LTD. (KR)

(*) Notice: Subject to any disclaimer, the term of this patent is extended or adjusted under 35 U.S.C. 154(b) by 0 days.

(21) Appl. No.: 14/453,710

(22) Filed: Aug. 7, 2014

(65) Prior Publication Data

US 2014/0349425 A1 Nov. 27, 2014

Related U.S. Application Data

(62) Division of application No. 13/710,759, filed on Dec. 11, 2012, now abandoned.

(30) Foreign Application Priority Data

Apr. 17, 2012 (KR) .................. 10-2012-0039496

(51) Int. Cl.
*G03F 7/20* (2006.01)
*H01L 27/12* (2006.01)
*G03F 7/031* (2006.01)
*G03F 7/075* (2006.01)
*G03F 7/00* (2006.01)
*G02B 1/12* (2006.01)
*G02B 5/30* (2006.01)
*G02F 1/1335* (2006.01)

(52) U.S. Cl.
CPC ............ *H01L 27/1288* (2013.01); *G03F 7/031* (2013.01); *G03F 7/0757* (2013.01); *G03F 7/0002* (2013.01); *G02B 1/12* (2013.01); *G02B 5/3058* (2013.01); *G02F 1/133528* (2013.01); *G02F 2001/133548* (2013.01)

(58) Field of Classification Search
CPC ........... G02B 5/3058; B29D 11/00663; B32B 2307/42; B32B 38/10; C25D 1/10; G03F 7/0002; H01L 51/0014
USPC ............... 430/322, 270.1, 323, 256, 319, 320
See application file for complete search history.

(56) References Cited

U.S. PATENT DOCUMENTS 5,527,578 A 6/1996 Mazurek et al.
6,231,922 B1 5/2001 Kline
(Continued)

FOREIGN PATENT DOCUMENTS

JP 62-41201 2/1987
JP 2010118434 A 5/2010
JP 2011060818 A 3/2011

*Primary Examiner* — Caleen Sullivan
(74) *Attorney, Agent, or Firm* — Cantor Colburn LLP

(57) ABSTRACT

A photoresist composition includes about 65% by weight to about 80% by weight of a mono-functional monomer, about 5% by weight to about 20% by weight of a di-functional monomer, about 1% by weight to about 10% by weight of a multi-functional monomer including three or more functional groups, about 1% by weight to about 5% by weight of a photoinitiator, and less than about 1% by weight of a surfactant, each based on a total weight of the photoresist composition.

14 Claims, 6 Drawing Sheets

(56) References Cited

U.S. PATENT DOCUMENTS

| | | |
|---|---|---|
| 6,376,069 B1 | 4/2002 | Bilodeau et al. |
| 2002/0191880 A1* | 12/2002 | Borrelli et al. .................. 385/11 |
| 2003/0165686 A1 | 9/2003 | Blackburn et al. |
| 2010/0259821 A1 | 10/2010 | Kaida et al. |
| 2012/0305523 A1* | 12/2012 | Fernando et al. ............... 216/24 |

* cited by examiner

PHOTORESIST COMPOSITION, METHOD OF MANUFACTURING A POLARIZER AND METHOD OF MANUFACTURING A DISPLAY SUBSTRATE USING THE SAME

This application is a divisional application of U.S. application Ser. No. 13/710,759 filed on Dec. 11, 2012, which claims priority to Korean Patent Application No. 10-2012-0039496, filed on Apr. 17, 2012, and all the benefits accruing therefrom under 35 U.S.C. §119, the contents of which are herein incorporated by reference in its entirety.

BACKGROUND

1. Field

Exemplary embodiments relate to a photoresist composition, a method of manufacturing a polarizer and a method of manufacturing a display substrate using the photoresist composition. More particularly, exemplary embodiments relate to a photoresist composition that may be used in a nanoimprinting process for manufacturing a polarizer, a method of manufacturing a polarizer and a method of a display substrate using the photoresist composition.

2. Description of the Related Art

Generally, a liquid crystal display device is thinner and lighter than a cathode ray tube ("CRT") display device, such that the liquid crystal display is widely used. However, the liquid crystal display device uses a liquid crystal layer within a liquid crystal display panel as a photo-shutter in cooperation with linearly polarized light irradiated into the liquid crystal display panel to display an image. The liquid crystal display device also includes a backlight assembly which provides light to the liquid crystal display panel.

The liquid crystal display panel includes a polarizer for changing a randomly polarized light, which is irradiated from the backlight assembly, to a linearly polarized light. The polarizer absorbs light irradiated from the backlight assembly, so that the polarizer undesirably has a low level of efficiency and heat-resistance, and is easily deteriorated by an ultraviolet light.

As an alternative polarizer technology which may be substituted for a conventional polarizer, a technology using a wire grid pattern is being developed. A width and a pitch between wire grids of the wire grid pattern may be tens of nanometers to hundreds of nanometers in size, which is shorter than a visible light wavelength so that light polarized by the wire grid pattern may have a polarization degree substantially similar to light polarized by the conventional polarizer.

For manufacturing the wire grid polarizer, a nanoimprinting method may be used. According to the nanoimprinting method, a mold patterned to have a wire grid shape is prepared, the wire grid shape of the mold is transcribed onto a photoresist layer which is on a metal layer to form a photoresist pattern, and the photoresist pattern is used as a mask to etch the underlying metal layer.

However, a photoresist pattern formed by a conventional photoresist composition which is used in the nanoimprinting method is easily separated from a metal layer during a dry-etching process using a plasma gas, so that the efficiency and the reliability of the polarizer formed by the nanoimprinting method are reduced. Thus there remains a need for an improved photoresist composition.

SUMMARY

One or more exemplary embodiment provides a photoresist composition forming an improved photoresist pattern.

One or more exemplary embodiments also provides a method of manufacturing a polarizer using the photoresist composition.

One or more exemplary embodiments also provides a method of manufacturing a display substrate using the photoresist composition.

According to an exemplary embodiment, a photoresist composition is provided. The photoresist composition includes about 65 percent (%) by weight to about 80% by weight of a mono-functional monomer; about 5% by weight to about 20% by weight of a di-functional monomer; about 1% by weight to about 10% by weight of a multi-functional monomer including three or more functional groups; about 1% by weight to about 5% by weight of a photoinitiator; and less than about 1% by weight of a surfactant, each based on a total weight of the photoresist composition.

In an exemplary embodiment, the mono-functional monomer may include at least one selected from glycidyl acrylate, glycidyl methacrylate, hydroxyethyl methacrylate, 2-hydroxy-3-phenoxy-propyl acrylate, diethylene methylether methacrylate, hydroxyethyl acrylate, butyl methacrylate, hydroxypropyl acrylate, 2-phenoxyethyl acrylate, 2-phenoxyethyl methacrylate, 3,3,5-trimethylcyclohexyl methacrylate, isobornyl acrylate, isobornyl methacrylate, isodecyl acrylate, isodecyl methacrylate, isooctyl acrylate, lauryl acrylate, stearyl acrylate, tetrahydrofurfuryl acrylate and tridecyl acrylate.

In an exemplary embodiment, the di-functional monomer may include at least one selected from 1,6-hexanediol diacrylate, 1,6-hexanediol dimethacrylate, ethyleneglycol dimethacrylate, diethylene dimethacrylate, 1,1,2-dodecanediol dimethacrylate, 1,4-butanediol dimethacrylate, neopentylglycol diacrylate, diethylene diacrylate, dipropyleneglycol diacrylate, bisphenol A diacrylate, bisphenol A dimethacrylate, ethyleneglycol diacrylate, tetraethyleneglycol diacrylate, tricyclodecanedimethanol diacrylate and triethyleneglycol diacrylate.

In an exemplary embodiment, the multi-functional monomer may include at least one selected from pentaerythritol triacrylate, pentaerythritol tetraacrylate, trimethylpropane triacrylate, trimethylpropane trimethaacrylate, grycerol triacrylate, tri(2-hydroxyethyl) isocyanurate triacrylate, di-trimethylpropane tetraacrylate, dipentaerythritol pentaacrylate and pentaerythritol tetraacrylate.

In an exemplary embodiment, the photoinitiator may include at least one selected from 2-benzyl-2-(dimethylamino)-1-[4-(morpholinyl)phenyl]-1-butanone, phenyl bis (2,4,6-trimethyl)benzoyl and 1-hydroxycyclohexyl phenylketone.

According to another exemplary embodiment, a method of forming a polarizer includes providing a reflective layer on a base substrate; coating a photoresist composition on the reflective layer to form a photoresist coating layer, the photoresist composition including: about 65% by weight to about 80% by weight of a mono-functional monomer, about 5% by weight to about 20% by weight of a di-functional monomer, about 1% by weight to about 10% by weight of a multi-functional monomer including three or more functional groups, about 1% by weight to about 5% by weight of a photoinitiator, and less than about 1% by weight of a surfactant, each based on a total weight of the photoresist composition; contacting the photoresist coating layer with a stamp having a wire grid shape to pattern the photoresist coating layer; curing the patterned photoresist layer to form a photoresist pattern having the wire grid shape; removing the stamp from photoresist pattern having the wire grid shape; and etching the reflective layer using the photoresist pattern as a mask, to form a wire grid pattern to form the polarizer.

In an exemplary embodiment, the reflective layer may include a metal layer, and a protective layer on the metal layer.

In an exemplary embodiment, the metal layer may include at least one selected from nickel, aluminum, titanium, silver and chrome.

In an exemplary embodiment, the protective layer may include at least one selected from a silicon nitride and a silicon oxide.

In an exemplary embodiment, the curing the photoresist coating layer includes irradiating an ultraviolet light onto the photoresist coating layer.

In an exemplary embodiment, the photoresist pattern may include a first portion having a first thickness, and a second portion having a second thickness less than the first thickness. Before etching the reflective layer, the second portion of the photoresist pattern may be removed to expose a portion of the reflective layer.

In an exemplary embodiment, the removing the second portion of the photoresist pattern may include applying a plasma to an entirety of the photoresist pattern.

According to another exemplary embodiment, another method of manufacturing a display substrate includes: providing a reflective layer on a base substrate, coating a photoresist composition on the reflective layer to form a photoresist coating layer, the photoresist composition including about 65% by weight to about 80% by weight of a mono-functional monomer, about 5% by weight to about 20% by weight of a di-functional monomer, about 1% by weight to about 10% by weight of a multi-functional monomer including three or more functional groups, about 1% by weight to about 5% by weight of a photoinitiator, and less than about 1% by weight of a surfactant, each based on a total weight of the photoresist composition; contacting the photoresist coating layer with a stamp having a wire grid shape to pattern the photoresist coating layer; curing the patterned photoresist coating layer to form a photoresist pattern having the wire grid shape; removing the stamp from the photoresist pattern having the wire grid shape; etching the reflective layer using the photoresist pattern as a mask to form a wire grid pattern; providing a planarizing protecting film on the wire grid pattern; and providing a switching element array on the planarizing protecting film to manufacture the display substrate.

According to another exemplary embodiment, a method of manufacturing a display substrate includes: providing a reflective layer on a first surface of a base substrate, coating a photoresist composition on the reflective layer to form a photoresist coating layer, the photoresist composition including about 65% by weight to about 80% by weight of a mono-functional monomer, about 5% by weight to about 20% by weight of a di-functional monomer, about 1% by weight to about 10% by weight of a multi-functional monomer including three or more functional groups, about 1% by weight to about 5% by weight of a photoinitiator, and less than about 1% by weight of a surfactant, each based on a total weight of the photoresist composition; contacting the photoresist coating layer with a stamp having a wire grid shape to pattern the photoresist coating layer; curing the patterned photoresist coating layer to form a photoresist pattern having the wire grid shape; removing the stamp from the photoresist pattern having the wire grid shape; etching the reflective layer using the photoresist pattern as a mask to form a wire grid pattern; providing a planarizing protecting film on the wire grid pattern; and providing a switching element array on a second surface opposing to the first substrate of the base substrate to manufacture the display substrate.

According to one or more exemplary embodiment of the photoresist composition, the method of manufacturing of a polarizer and the method of manufacturing a display substrate, a photoresist pattern which has a high level of resistance to a dry-etching process using a plasma gas, may be formed. Thus, the reliability of an imprinting or nanoimprinting process for manufacturing a polarizer is improved. Furthermore, a viscosity of the photoresist composition is controlled by using a mono-functional monomer, and the photoresist composition may exclude an extra solvent used in a conventional photoresist composition. Thus, a pre-baking process for drying the solvent is omitted, so that the manufacturing efficiency may be improved.

BRIEF DESCRIPTION OF THE DRAWINGS

The above and other features and advantages will become more apparent by describing in detailed exemplary embodiments thereof with reference to the accompanying drawings, in which.

DETAILED DESCRIPTION

Figure 1:
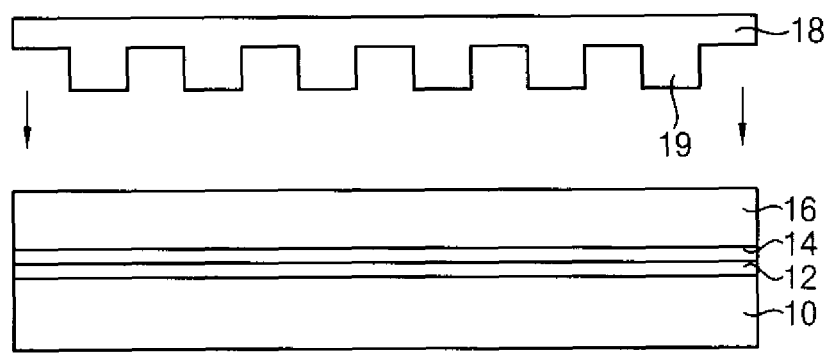
FIG. 1 to FIG. 6 are cross-sectional views illustrating an exemplary embodiment of a method of manufacturing a polarizer.

It will be understood that when an element or layer is referred to as being "on" or "connected to" another element or layer, the element or layer can be directly on or connected to another element or layer or intervening elements or layers. In contrast, when an element is referred to as being "directly on" or "directly connected to" another element or layer, there are no intervening elements or layers present. As used herein, connected may refer to elements being physically and/or electrically connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" or "under" relative to other elements or features would then be oriented "above" relative to the other elements or features. Thus, the exemplary term "under" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be described in detail with reference to the accompanying drawings.

Hereinafter, an exemplary embodiment of a photoresist composition according to will be explained. Thereafter, exemplary embodiments of a method of manufacturing a polarizer and a method of manufacturing a display substrate will be explained in detail with reference to the accompanying drawings.

An exemplary embodiment of a photoresist composition includes about 65 percent (%) by weight to about 80% by weight of a mono-functional monomer, about 5% by weight to about 20% by weight of a di-functional monomer, about 1% by weight to about 10% by weight of a multi-functional monomer including three or more functional groups, about 1% by weight to about 5% by weight of a photoinitiator, and less than about 1% by weight of a surfactant, each based on a total weight of the photoresist composition.

The mono-functional monomer has a single reactive functional group. When light is irradiated onto the photoresist composition, the mono-functional monomer is activated by the photoinitiator, and the mono-functional monomer forms a chain polymer by combining with at least one of the mono-functional monomer, the di-functional monomer or the multi-functional monomer. The mono-functional monomer has a lower viscosity than the di-functional monomer and the multi-functional monomer, and the mono-functional monomer may serve as a solvent to provide a photoresist composition having a suitable viscosity. Furthermore, the mono-functional monomer may have a faster activation rate than the di-functional monomer and the multi-functional monomer. Thus, the mono-functional monomer may increase a photo-curing speed of the photoresist composition.

In an exemplary embodiment, the mono-functional monomer includes a (meth)acrylate group. The mono-functional monomer may include an epoxy group as well as a (meth)acrylate group.

Examples of the mono-functional monomer may include glycidyl acrylate, glycidyl methacrylate, hydroxyethyl methacrylate, 2-hydroxy-3-phenoxy-propyl acrylate, diethylene glycol methylether methacrylate, hydroxy ethylacrylate, butyl methacrylate, hydroxypropyl acrylate, 2-phenoxyethyl acrylate, 2-phenoxyethyl methacrylate, 3,3,5-trimethylcyclohexyl methacrylate, isobornyl acrylate, isobornyl methacrylate, isodecyl acrylate, isodecyl methacrylate, isooctyl acrylate, lauryl acrylate, stearyl acrylate, tetrahydrofurfuryl acrylate, tridecyl acrylate and the like. These can be used each alone or in a combination thereof.

When an amount of the mono-functional monomer is less than about 65% by weight, based on the total weight of the photoresist composition, the viscosity of a composition is increased, and a pattern having a suitable resolution may not be easily imprinted. When the amount of the mono-functional group is greater than about 80% by weight, cross-linking from photo-curing may not be sufficient, and the stability of a photoresist pattern may be reduced. In an embodiment, the amount of the mono-functional monomer is between about 65% by weight and about 80% by weight, based on the total weight of the photoresist composition.

The di-functional monomer has two reactive functional groups. The di-functional monomer may have a lower viscosity than the multi-functional monomer, and the di-functional monomer may prevent an increase of the viscosity of the composition. The di-functional monomer forms a chain polymer by combining with the di-functional monomer, the mono-functional monomer or the multi-functional monomer, or the di-functional group may be cross-linked with an adjacent polymer chain.

In an exemplary embodiment, the di-functional monomer includes a (meth)acrylate group. Examples of the di-functional monomer may include 1,6-hexanediol diacrylate, 1,6-hexanediol dimethacrylate, ethylene glycol dimethacrylate, diethylene glycol dimethacrylate, 1,1,2-dodecanediol dimethacrylate, 1,4-butanediol dimethacrylate, neopentyl glycol diacrylate, diethylene glycol diacrylate, dipropylene glycol diacrylate, bisphenol A diacrylate, bisphenol A dimethacrylate, ethylene glycol diacrylate, tetraethylene glycol diacrylate, tricyclodecane dimethanol diacrylate, triethylene glycol diacrylate and the like. These can be used each alone or in a combination thereof. In an embodiment, the di-functional monomer may include an epoxy group as well as a (meth)acrylate group.

When an amount of the di-functional monomer is less than about 5% by weight, based on the total weight of the photoresist composition, cross-linking by photo-curing may not be sufficient, so that the stability of the photoresist pattern may be reduced. When an amount of the di-functional monomer is greater than about 20% by weight, the viscosity of a composition may be increased, pattern having suitable resolution may not be easily imprinted. The amount of the di-functional monomer may be between about 5% by weight and about 20% by weight, based on the total weight of the photoresist composition. In one exemplary embodiment, the amount of the di-functional monomer may be between 8% by weight and about 10% by weight, based on the total weight of the photoresist composition.

The multi-functional monomer includes three or more reactive functional groups. The multi-functional monomer may form a chain polymer by combining with a multi-functional monomer, the mono-functional monomer or the di-functional monomer, or the multi-functional monomer may be cross-linked with an adjacent polymer chain.

In an embodiment, the multi-functional monomer includes a (meth)acrylate group. Example of the multi-functional monomer may include pentaerythritol triacrylate, pentaerythritol tetraacrylate, trimethylpropane triacrylate, trimethylpropane trimethacrylate, glycerol triacrylate, tris(2-hydroxyethyl) isocyanurate triacrylate, di-trimethylpropane tetraacrylate, dipentaerythritol pentaacrylate, pentaerythrotol tetraacrylate and the like. These can each be used alone or in a combination thereof.

When an amount of the multi-functional monomer is less than about 1% by weight, based on a total weight of the photoresist composition, cross-linking by photo-curing may not be sufficient, and the stability of the photoresist pattern may be reduced. When the amount of the multi-functional monomer is greater than about 10% by weight, based on a total weight of the photoresist composition, a viscosity may be increased, and a pattern having suitable resolution may not be easily imprinted. Thus, the amount of the multi-functional monomer is between about 1% by weight and about 10% by weight, based on the total weight of the photoresist composition. In one exemplary embodiment, the amount of the multi-functional monomer may be between about 1% by weight and about 5% by weight.

The photoinitiator is activatable by a light, for example, an ultraviolet light, so that the reaction of the monomers is activated by the photoinitiator. Examples of the photoinitiator may include 2-benzyl-2-(dimethylamino)-1-[4-(mopholinyl) phenyl]-1-butanone, phenyl bis(2,4,6-trimethyl)benzoyl, 1-hydroxycycolhexyl phenyl ketone and the like. These can be used alone or in combination thereof.

Furthermore, a photoinitiator, which generates a plurality of active sites may be used, and may be added to the examples of the photoinitiator or substituted for the photoinitiator.

When an amount of the photoinitiator is less than 1% by weight, based on a total weight of the photoresist composition, the photo-curing reaction rate may be reduced or a cross-linking may not be sufficient. Thus, the amount of the photoinitiator is between about 1% by weight and about 5% by weight, based on the total weight of the photoresist composition.

The surfactant may be used to control the surface tension of the photoresist composition and the surface energy of the photoresist composition. Examples of the surfactant may include a silicone-based surfactant or a fluoride-based surfactant, in detail, the surfactant may include FZ-2110, FZ-2112 (available from Dow Corning Co., Ltd.), BYK®-345, BYK®-346, BYK®-348 (available from BYK Co., Ltd.) and the like. These can each be used alone or in a combination thereof.

An exemplary embodiment of a photoresist composition may be used to form a photoresist pattern which has a high resistance with respect to a dry-etching process using a plasma gas. Thus, the reliability of a nanoimprinting process using the photoresist pattern for manufacturing a polarizer may be improved. Furthermore, a viscosity of the photoresist composition may be selected by selection of suitable a mono-functional monomer of the photoresist composition, so that a solvent may be omitted from the photoresist composition, unlike an extra solvent which is used in a conventional photoresist composition. Where the solvent is omitted, a pre-baking process for drying the solvent may also be omitted, and thus efficiency in manufacturing the polarizer may be increased.

Hereinafter, an exemplary embodiment of a method of manufacturing a polarizer, according to, will be described with reference to the accompanying drawings.

FIG. 1 to FIG. 6 are cross-sectional views illustrating an exemplary embodiment of a method of manufacturing a polarizer.

Referring to FIG. 1, a reflective layer including a metal layer is formed (e.g., provided) on a base substrate. Particularly, a metal layer 12 is disposed, e.g., formed, on a base substrate 10, and a protective layer 14 is disposed, e.g., formed, on the metal layer 12. Thereafter, a photoresist composition is coated on the protective layer 14 to form a photoresist coating layer 16.

A metal including nickel, aluminum, titanium, silver, chrome or the like is deposited on the base substrate 10 by using a sputtering method or the like for forming the metal layer 12. In one exemplary embodiment, for example, a thickness of the metal layer 12 may be about 50 nanometers (nm) to about 200 nm.

The protective layer 14 is disposed on the metal layer 12, so that the protective layer 14 prevents damaging of the metal layer 12 such as from a process that dry-etches a photoresist pattern formed from the photoresist composition. The protective layer 14 may include silicon oxide, silicon nitride or the like, and a thickness of the protective layer 14 may be about 30 nm to about 100 nm.

The photoresist composition includes about 65% by weight to about 80% by weight of a mono-functional monomer, about 5% by weight to about 20% by weight of a di-functional monomer, about 1% by weight to 10% by weight of a multi-functional monomer including three or more functional groups, about 1% by weight to about 5% by weight of a photoinitiator, and less than about 1% by weight of a surfactant, based on the total weight of the photoresist composition.

The mono-functional monomer includes a reactive functional group, the di-functional monomer includes two reactive functional groups, and the multi-functional monomer includes at least three reactive functional groups. The functional group may include a (meth)acrylate group.

The photoresist composition illustrated in the exemplary embodiment of the method of manufacturing a polarizer is substantially the same as the previously described exemplary embodiment of the photoresist composition, so that any repetitive explanation concerning the same elements will be omitted.

A stamp 18 having a wire grid shape is disposed on the photoresist coating layer 16, and a pressure is applied to the stamp 18. Thus, the wire grid pattern of the stamp 18 is transcribed into the photoresist coating layer 16.

Particularly, the stamp 18 includes a plurality of protruding portions 19 which are extended in a direction and vertically arrayed to the direction. In one exemplary embodiment, the protruding portions 19 may each have a longitudinal axis which extends in a first direction, the protruding portions 19 may be arranged in a second direction (e.g., left to right in FIG. 1) such as perpendicular to the first direction, and the protruding portions 19 protrude from a base portion in a third direction (e.g., up and down in FIG. 1) which may be orthogonal to the first and second directions. The protruding portions 19 are spaced apart from each other by a predetermined interval, such as in the second direction.

In one exemplary embodiment, for example, the stamp 18 may include an inorganic material, and the inorganic material may include silicon, silicon oxide, quartz glass or the like. Alternatively, the stamp 18 may be formed by curing a thermo-cured resin, a thermo-plastic resin, a photo-curing resin and the like. In an exemplary embodiment, for example, a polyimide resin, epoxy resin, polyurethane resin, polypropylene resin, polyethylene resin, polyethyleneterephthalate resin, polymethylmethacrylate resin or the like may be used to form the stamp 18.

In an exemplary embodiment, the stamp 18 may be transparent, and may have high ultraviolet transmittance. For more easily separating the stamp 18 from the photoresist coating layer 16 after applying a pressure to the stamp 18, the stamp 18 may include a releasing layer (not illustrated) which contacts the photoresist coating layer 16. The release layer may include a compound having a fluoroalkyl group.

Figure 2:
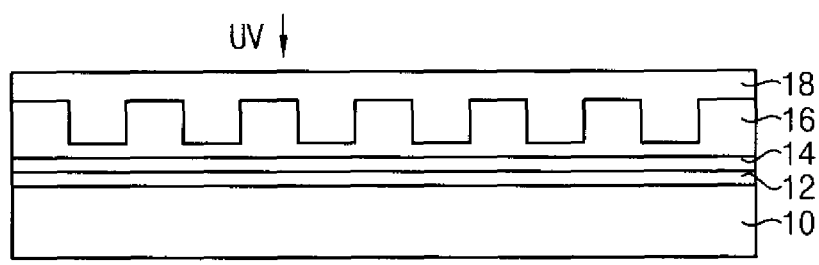

Referring to FIG. 2, while the pressure is applied to the stamp 18 to transcribe the wire grid pattern into the photoresist coating layer 16, a light, for example, an ultraviolet ("UV") light is irradiated onto the photoresist coating layer 16 to cure the photoresist coating layer 16. The photoresist coating layer 16 is patterned by the pressure from the stamp 18 to form a photoresist pattern 17 having a wire grid which has a convex and concave cross-sectional shape.

A width of a protruding portion 19 of the wire grid and an interval length between adjacent protruding portions 19 of the wire grid may be less than half the visible light wavelength, for example, may be about 30 nm to about 150 nm. The width and the interval length may be taken in the second direction (e.g., left to right in FIG. 2).

The light, applied from a light source which is disposed above and on the stamp 18, passes through the stamp 18, and is irradiated onto the photoresist coating layer 16. Thus, to promote transmission of the light through the stamp 18, to the stamp 18 has a high light-transmittance ratio.

Figure 3:
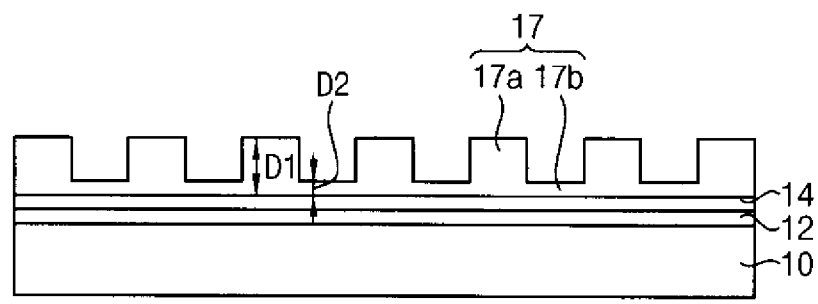

Referring to FIG. 3, the stamp 18 is removed from the photoresist pattern 17. The photoresist pattern 17 has a wire grid which has a convex and concave cross-sectional shape. The photoresist pattern 17 includes a first portion 17a having a first thickness D1, and a second portion 17b having a second thickness D2 which is less than the first thickness D1. The thicknesses may be taken in the third direction (e.g., up and down in FIG. 3).

Figure 4:
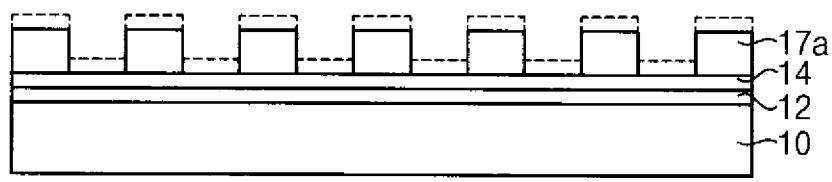

Referring FIG. 4, before etching the metal layer 12 and the protective layer 14, the second portion 17b of the photoresist pattern 17 is removed as indicated by the dotted lines. In one exemplary embodiment, for example, a plasma is applied to an entire of the photoresist pattern 17 for dry-etching the photoresist pattern 17. In an alternative exemplary embodiment, for example, an oxygen plasma or the like may be used in dry-etching the photoresist pattern 17.

In an exemplary embodiment, the photoresist pattern 17 formed from the photoresist compositions may have a high resistance with respect to a dry-etching process. Thus, in a process of removing the second portion 17b of the photoresist pattern 17, damage to the first portion 17a may be reduced or effectively prevented. Therefore, since the photoresist composition limits or prevents damage to the photoresist pattern 17 the reliability of a final metal pattern formed from the metal layer 12 such as by etching may be improved.

The photoresist pattern 17 is entirely dry-etched, so that, in a process of removing the second portion 17b, the thickness of the first portion 17a is reduced as indicated by the dotted lines in FIG. 4. By removing the second portion 17b, the protective layer 14 is partially exposed.

Figure 5:
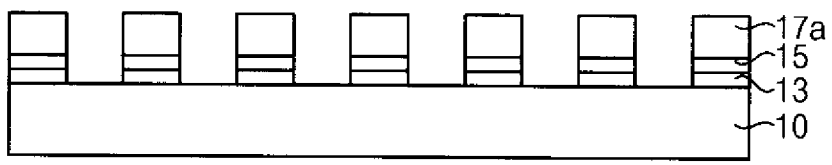
Figure 6:
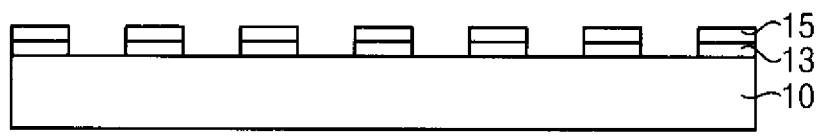

Referring to FIG. 5 and FIG. 6, by using a remaining photoresist pattern 17a as a mask, the metal layer 12 and the protective layer 14 are dry-etched or wet-etched, to form a metal pattern 13 and a protective pattern 15, respectively, After the metal pattern 13 and the protective pattern 15 are formed, the photoresist pattern 17a is removed. A plurality of metal patterns 15 and a plurality of protective patterns 15 are formed on the base substrate 10, and may be otherwise referred to as a metal pattern layer and a protective pattern layer, respectively.

The metal pattern 13, as similar to the protruding portion 19 of the stamp 18, extends to a direction to have a substantially linear shape in a plan view of the base substrate, and adjacent metal patterns are spaced apart from each other. The metal pattern 13 functions as a wire grid pattern, which transmits or reflects a light according to a polarized component of the light. In an exemplary embodiment, a plurality of metal patterns 13 may each have a longitudinal axis which extends in a first direction, the metal patterns 13 may be arranged in a second direction (e.g., left to right in FIG. 6) such as perpendicular to the first direction, and a thickness of the metal patterns 13 is taken in a third direction (e.g., up and down in FIG. 6) which may be orthogonal to the first and second directions. The same may be said for a plurality of protective patterns 15.

For protecting the metal pattern 13 and planarizing an surface of a polarizer including the metal pattern 13, a protecting film (not illustrated) may be formed on the base substrate 10.

According to an exemplary embodiment, in a manufacturing process of a polarizer by nanoimprinting, the reliability and the productivity of a polarizer may be increased by reducing or effectively preventing damage to a photoresist pattern mask.

Hereinafter, an exemplary embodiment of a method of manufacturing a display substrate will be explained with reference to the accompanying drawings.

FIG. 7 to FIG. 13 are cross-sectional views illustrating an exemplary embodiment of a method of manufacturing a display substrate.

Figure 7:
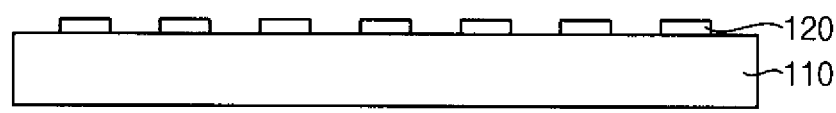
FIG. 7 to FIG. 13 are cross-sectional views illustrating an exemplary embodiment of a method of manufacturing a display substrate.

Referring to FIG. 7, a plurality of wire grid patterns 120 is formed on a base substrate 110. The wire grid patterns 120 are extended in a direction, and adjacent wire grid patterns are spaced apart from the each other by a predetermined interval. The wire grid pattern 120 functions as a polarizer which transmits or reflects a light irradiated thereto, according to a polarized component of the light.

The wire grid pattern 120 includes a metal layer. The wire grid pattern 120 may further include a protective layer on a metal layer to protect the metal layer from damage during a forming process of the wire grid pattern 120.

A method of forming the wire grid pattern 120 is substantially the same with the previously explained exemplary embodiment of the method of manufacturing a polarizer illustrated in FIG. 1 to FIG. 6. Thus, any repetitive explanation concerning the same elements will be omitted.

Figure 8:
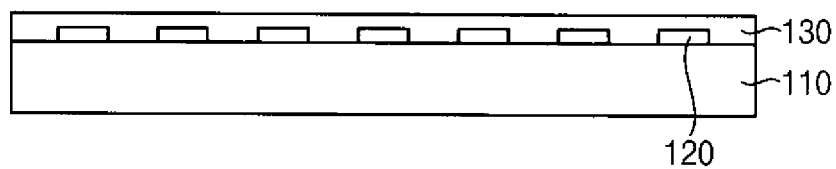

Referring to FIG. 8, a protecting film 130 is formed on the base substrate 110 including the wire grid pattern 120 thereon. The protecting film 130 may protect the wire grid pattern 120, and planarize an upper surface of the wire grid pattern 120 on the base substrate 110.

In an exemplary embodiment, for example, after coating a thermo-curing composition or a photo-curing composition, which include an epoxy resin, polyimide resin, phenol resin, polymethylmethacrylate resin or the like, the protecting film 130 may be formed by curing the thermo-curing composition or the photo-curing composition.

Figure 9:
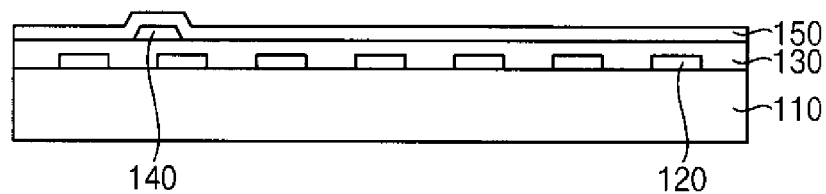

Referring to FIG. 9, a gate metal layer is formed on the protecting film 130. The gate metal layer is patterned to form a gate pattern including a gate line and a gate electrode 140. The gate line is extended in a direction, and the gate electrode 140 is connected to the gate line.

In exemplary embodiments, for example, a material that may be used for the gate pattern may include at least one selected from molybdenum, aluminum, chrome, nickel, copper, titanium, manganese, and tungsten and the like. The gate pattern may have a mono-layer structure, or a multi-layer structure having at least two metal layers which are different from each other.

Thereafter, a first insulator film 150 covering the gate pattern is formed on the protecting film 130. In one exemplary embodiment, the first insulator film 150 may be formed by depositing silicon oxide, silicon nitride or the like by using a chemical-vapor deposition ("CVD"), but is not limited thereto or thereby.

Figure 10:
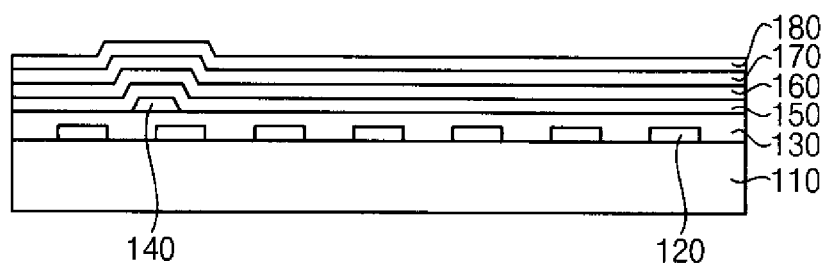

Referring to FIG. 10, an active layer 160, an ohmic contact layer 170 and a source metal layer 180 is sequentially formed on the first insulator film 150.

In one exemplary embodiment, for example, the active layer 160 may include amorphous silicon, and the ohmic contact layer 170 may be formed by doping impurities to amorphous silicon. In exemplary embodiments, examples of a material that may be used for the source metal layer 180 may include molybdenum, aluminum, chrome, nickel, copper, titanium, manganese, tungsten and the like. These can be used alone or in an alloy thereof. Furthermore, the source metal layer 180 may have a mono-layer structure, or a multi-layer structure having at least two metal layers different from each other.

Figure 11:
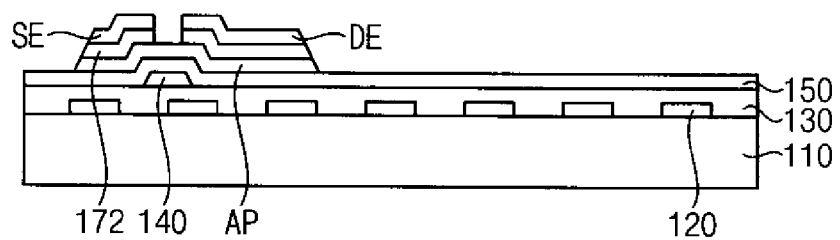

Referring to FIG. 11, the active layer 160, the ohmic contact layer 170 and the source metal layer 180 are patterned to form an active pattern AP, an ohmic contact pattern 172 and a source pattern. For patterning the active layer 160, the ohmic contact layer 170 and the source metal layer 180 by using a mask, a photoresist pattern having different thicknesses may be formed on the active layer 160 by using a half-tone mask or the like.

The active pattern AP overlaps the gate electrode 140. The ohmic contact pattern 172 is formed on the active pattern AP, and the ohmic contact pattern 172 includes portions which are spaced apart from each other.

The source pattern includes a data line (not illustrated) extended in a direction which crosses the gate line, a source electrode SE connected to the data line, and a drain electrode DE spaced apart from the source electrode SE. In one exemplary embodiment, for example, the data line may have a longitudinal axis which is extended in a direction substantially vertical (e.g., perpendicular) to a longitudinal axis of the gate line, but is not limited thereto or thereby. The source electrode SE and the drain electrode DE are spaced apart from each other to expose a portion of the active pattern AP.

Figure 12:
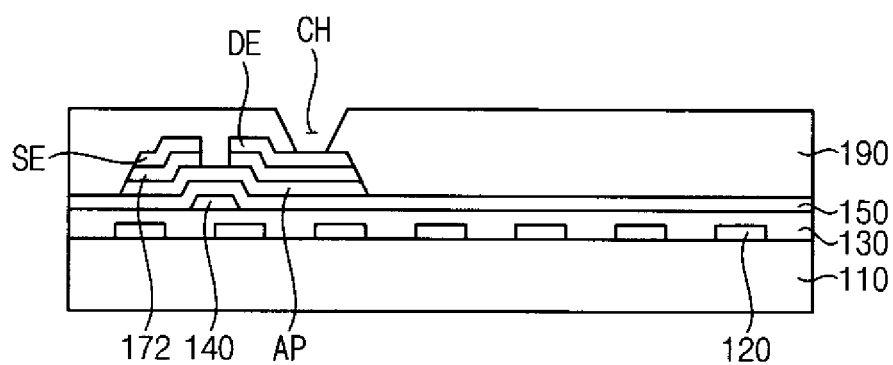

Referring to FIG. 12, a second insulator film 190, which covers the active pattern AP, the ohmic contact pattern 172 and the source pattern is formed. A contact hole CH is further formed in the second insulator film 190 and partially exposes the drain electrode DE of the source pattern.

The second insulator film 190 may include an organic material or an inorganic material. In one exemplary embodiment, for example, the second insulator film 190 may include an organic insulator film formed from a photoresist composition. The photoresist composition is coated and cured to form the organic insulator film. In a curing process of the photoresist composition, after exposing the photoresist composition to a light, a light-exposed portion or a non-light-exposed portion is removed to form the contact hole CH.

In another exemplary embodiment, the second insulator film 190 may include an inorganic insulator film including a silicon oxide layer or a silicon nitride layer, which are formed by CVD and the like. After forming a photoresist pattern on the inorganic insulator film, the inorganic insulator film is partially etched to form the contact hole CH.

In another exemplary embodiment, the second insulator film 190 may include an organic insulator film and an inorganic insulator film. In one exemplary embodiment, for example, the inorganic insulator film which covers the active pattern AP, the ohmic contact pattern 172 and the source pattern is formed, and an organic insulator film may be formed on the inorganic insulator film.

Figure 13:
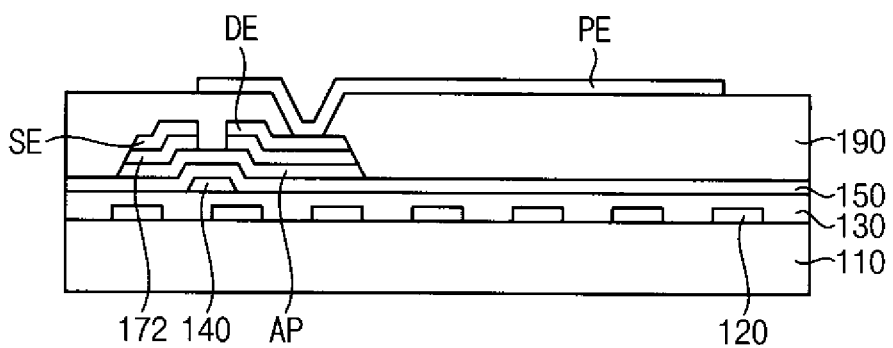

Referring to FIG. 13, a transparent electrode layer is formed on the second insulator layer 190. The transparent electrode layer may include a transparent conductive material including at least one selected from an indium-tin-oxide, an indium-zinc-oxide and the like.

Thereafter, transparent conductive material is patterned to form a pixel electrode PE. The pixel electrode PE contacts the drain electrode DE through the contact hole CH of the second insulator layer 190.

According to an exemplary embodiment, in a process of manufacturing a wire grid pattern using a nanoimprinting, the reliability and the productivity of a wire grid pattern is improved by reducing or effectively preventing damage of a photoresist pattern mask.

Figure 14:
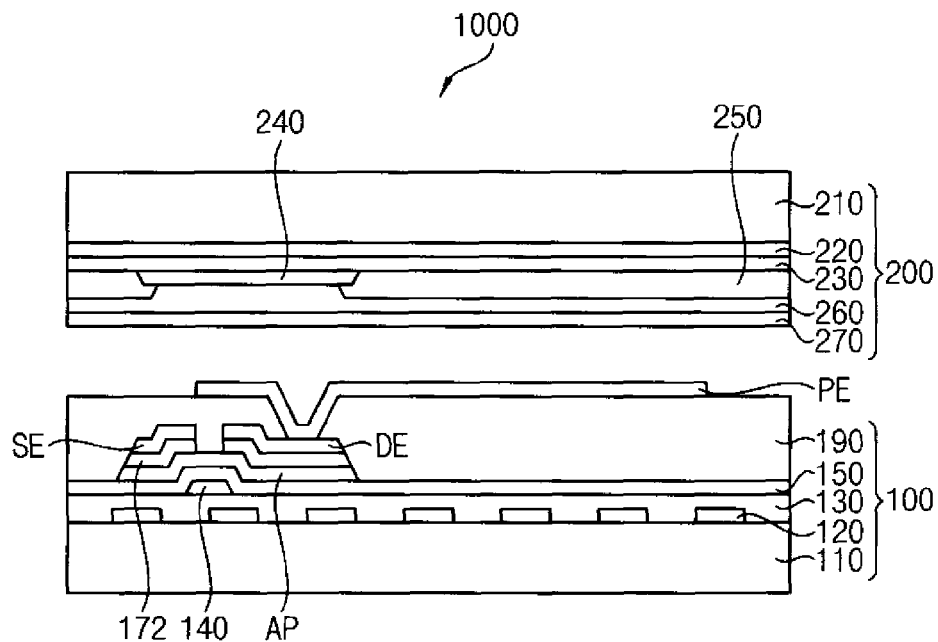
FIG. 14 is a cross-sectional view illustrating an exemplary embodiment of a display panel having a manufactured polarizer.

FIG. 14 is a cross-sectional view illustrating an exemplary embodiment of a display panel having a manufactured polarizer according to.

Referring to FIG. 14, the display panel 1000 includes an array substrate 100 and an opposing substrate 200.

The array substrate 100 includes a first base substrate 110, a first wire grid pattern 120 on the first base substrate 110, a first protecting film 130 covering the first wire grid pattern 120, a gate electrode 140 on the first protecting film 130, a first insulator film 150 covering the gate electrode 140, an active pattern AP on the first insulator film 150 and overlapping the gate electrode 140, an ohmic pattern 172 on the active pattern AP, a source electrode SE and a drain electrode DE which are on the ohmic contact pattern 172 and spaced apart from each other, a second insulator film 190 covering the source electrode SE and the drain electrode DE, and a pixel electrode PE on the second insulator film 190 and contacting the drain electrode DE. A switching element includes the gate electrode 140, the active pattern AP, the source electrode SE and the drain electrode DE. In an exemplary embodiment, a plurality of switching elements may be arranged with a configuration having a matrix shape to form a switching element array. The array substrate 100 is substantially the same to the exemplary embodiment of the display substrate illustrated in FIG. 13.

The first wire grid pattern 120 functions as a polarizer which transmits or reflects a light irradiated onto the first wire pattern 120, according to the polarized component of the light. In one exemplary embodiment, for example, a S-phase light which is substantially parallel with the first wire grid pattern 120 may be reflected by the first wire grid pattern 120, and a P-phase light which is substantially vertical (e.g., perpendicular to) the first wire grid pattern 120 may pass through the first wire grid pattern 120.

When a backlight assembly (not shown) is disposed under the array substrate 100, light initially reflected by the first wire grid pattern 120 may be reflected by a reflecting plate of the backlight assembly such that the light is irradiated onto the first wire grid pattern 120 again. According to the above recycling process of a light, the brightness of a display device employing the display panel 1000 and the backlight assembly is improved.

The opposing substrate 200 includes a second base substrate 210, a second wire grid pattern 220 on the second base substrate 210, a second protecting film 230 covering the second wire grid pattern 220, a black matrix 240 on the second protecting film 230, a color filter layer 250 on the second protecting film 230, a planarization film 260 covering the black matrix 240 and the color filter layer 250, and a common electrode 270 facing the array substrate 100 and on the planarization film 260.

The second wire grid pattern 220 is extended in a direction and adjacent second wire grid patterns 220 are spaced apart from each other at a predetermined interval. In one exemplary embodiment, for example, the second wire grid pattern 220 may have a longitudinal axis which is extended in a direction substantially vertical (e.g., perpendicular) to a longitudinal axis of the first wire grid pattern 120. The second wire grid pattern 220 functions as a polarizer, similar to the first wire grid pattern 120, such that is transmits or reflects a light irradiated in to the second wire pattern 220, according to the polarized component of the light. A method of forming the second wire grid pattern 220 and the second protecting film 230 may be substantially the same as a method of forming the first wire grid pattern 120 and the first protecting film 130.

In an alternative exemplary embodiment, the black matrix 240 and/or the planarization film 260 may be omitted. Furthermore, the color filter layer 250 and/or the common electrode 270 may be in the array substrate 100 instead of the opposing substrate 200.

Figure 15:
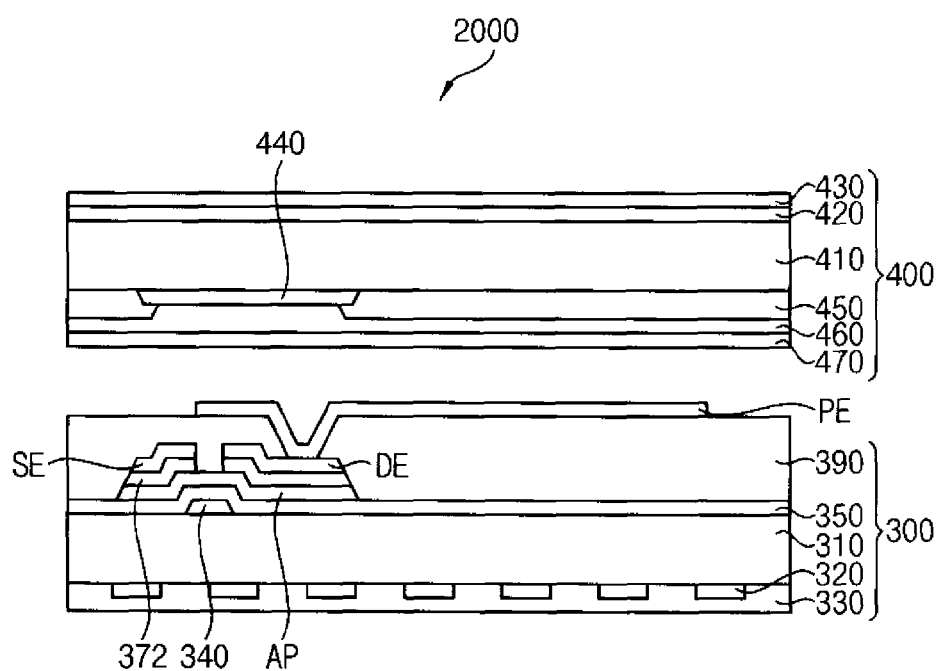
FIG. 15 is a cross-sectional view illustrating another exemplary embodiment of a display panel having a manufactured polarizer.

FIG. 15 is a cross-sectional view illustrating another exemplary embodiment of a display panel having a manufactured polarizer.

Referring to FIG. 15, a display panel 2000 includes an array substrate 300 and an opposing substrate 400.

The array substrate 300 includes a first base substrate 310, a first wire grid pattern 320 on a first plane of the base substrate 310 (e.g., a lower surface), a first protecting film 330 covering the first wire grid pattern 320, a gate electrode 340 on a second plane (e.g., an upper surface) which is opposite to the first plane of the first base substrate 310, a first insulator film 350 covering the gate electrode 340, an active pattern AP on the first insulator film 350 and overlapping the gate electrode 340, an ohmic pattern 372 on the active pattern AP, a source electrode SE and a drain electrode DE which are on the ohmic contact pattern 372 and spaced apart from each other, a second insulator film 390 covering the source electrode SE and the drain electrode DE, and a pixel electrode PE on the second insulator film 390 and contacting the drain electrode DE.

The array substrate 300 is substantially the same as the array substrate 100 illustrated in FIG. 14 except that the first wire grid pattern 320 and the first protecting film 330 are on the lower surface of the first base substrate 310 such that the first base substrate 310 is disposed between the first wire grid pattern 320 and a switching element.

The opposing substrate 400 includes a second base substrate 410, a second wire grid pattern 420 on a first plane of the second base substrate 410 (e.g., an upper surface), a second protecting film 430 covering the second wire grid pattern 420, a black matrix 440 on a second plane (e.g., a lower surface) which is opposing to the first plane and on the second base substrate 410, a color filter layer 450 on the second plane, a planarization film 460 covering the black matrix 440 and the color filter layer 450, and a common electrode 470 facing the array substrate 300 and on the planarization film 460.

The opposing substrate 400 is substantially the same as the opposing substrate 200 illustrated in FIG. 14 except that the second wire grid pattern 420 and the second protecting film 430 are on the upper surface of the second base substrate 410 such that the second base substrate 410 is disposed between the second wire grid pattern 420, and the black matrix 440 and the color filter layer 450.

In the exemplary embodiments illustrated in FIG. 14 and FIG. 15, wire grid patterns are included within a display panel. However, in another exemplary embodiment, the wire grid patterns may be on a polarizing plate separated from a display panel, or on an optical sheet such as a diffusion plate or the like.

The foregoing is illustrative and is not to be construed as limiting thereof. Although a few exemplary embodiments have been described, those skilled in the art will readily appreciate that many modifications are possible in the exemplary embodiments without materially departing from the novel teachings and advantages. Accordingly, all such modifications are intended to be included within the scope as defined in the claims.

What is claimed is:

1. A method of forming a polarizer, the method comprising:
   providing a reflective layer on a base substrate;
   coating a photoresist composition on the reflective layer to form a photoresist coating layer, the photoresist composition comprising:
      about 65 percent by weight to about 80 percent by weight of a mono-functional monomer,
      about 5 percent by weight to about 20 percent by weight of a di-functional monomer,
      about 1 percent by weight to about 10 percent by weight of a multi-functional monomer comprising three or more functional groups,
      about 1 percent by weight to about 5 percent by weight of a photoinitiator, and
      less than about 1 percent by weight of a surfactant, each based on a total weight of the photoresist composition;
   contacting the photoresist coating layer with a stamp having a wire grid shape to pattern the photoresist coating layer;
   curing the patterned photoresist coating layer to form a photoresist pattern having the wire grid shape;
   removing the stamp from the photoresist pattern having the wire grid shape;
   partially removing the photoresist pattern through dry-etching; and
   etching the reflective layer using the photoresist pattern as a mask to form a wire grid pattern to form the polarizer.

2. The method of claim 1, wherein the reflective layer comprises a metal layer, and a protective layer on the metal layer.

3. The method of claim 2, wherein the metal layer comprises at least one selected from nickel, aluminum, titanium, silver and chrome.

4. The method of claim 2, wherein the protective layer comprises at least one selected from a silicon nitride and a silicon oxide.

5. The method of claim 1, wherein the mono-functional monomer includes at least one selected glycidyl acrylate, glycidyl methacrylate, hydroxyethyl methacrylate, 2-hydroxy-3-phenoxy-propyl acrylate, diethylene methylether methacrylate, hydroxyethyl acrylate, butyl methacrylate, hydroxypropyl acrylate, 2-phenoxyethyl acrylate, 2-phenoxyethyl methacrylate, 3,3,5-trimethylcyclohexyl methacrylate, isobornyl acrylate, isobornyl methacrylate, isodecyl acrylate, isodecyl methacrylate, isooctyl acrylate, lauryl acrylate, stearyl acrylate, tetrahydrofurfuryl acrylate and tridecyl acrylate, wherein the di-functional monomer includes at least one selected from 1,6-hexanediol diacrylate, 1,6-hexanediol dimethacrylate, ethyleneglycol dimethacrylate, diethylene dimethacrylate, 1,1,2-dodecanediol dimethacrylate, 1,4-butanediol dimethacrylate, neopentylglycol diacrylate, diethylene diacrylate, dipropyleneglycol diacrylate, bisphenol A diacrylate, bisphenol A dimethacrylate, ethyleneglycol diacrylate, tetraethyleneglycol diacrylate, tricyclodecanedimethanol diacrylate and triethyleneglycol diacrylate, and wherein the multi-functional monomer includes at least one selected from pentaerythritol triacrylate, pentaerythritol tetraacrylate, trimethylpropane triacrylate, trimethylpropane trimethacrylate, glycerol triacrylate, tri(2-hydroxyethyl) isocyanurate triacrylate, di-trimethylpropane tetraacrylate, dipentaerythritol pentaacrylate and pentaerythritol tetraacrylate.

6. The method of claim 1, wherein the curing the patterned photoresist coating layer comprises irradiating an ultraviolet light onto the patterned photoresist coating layer.

7. The method of claim 1, wherein the photoresist pattern comprises:
 a first portion having a first thickness, and a second portion having a second thickness less than the first thickness, and
 wherein the second portion of the photoresist pattern is removed by the dry-etching to expose a portion of the reflective layer, before the etching the reflective layer.

8. The method of claim 7, wherein a plasma is applied to an entire of the photoresist pattern to remove the second portion of the photoresist pattern.

9. A method of manufacturing a display substrate, the method comprising:
 providing a reflective layer on a base substrate;
 coating a photoresist composition on the reflective layer to form a photoresist coating layer, the photoresist composition comprising
  about 65 percent by weight to about 80 percent by weight of a mono-functional monomer,
  about 5 percent by weight to about 20 percent by weight of a di-functional monomer,
  about 1 percent by weight to about 10 percent by weight of a multi-functional monomer comprising three or more functional groups,
  about 1 percent by weight to about 5 percent by weight of a photoinitiator, and
  less than about 1 percent by weight of a surfactant, each based on a total weight of the photoresist composition;
 contacting the photoresist coating layer with a stamp having a wire grid shape to pattern the photoresist coating layer;
 curing the patterned photoresist coating layer to form a photoresist pattern having the wire grid shape;
 removing the stamp from the photoresist pattern having the wire grid shape;
 etching the reflective layer using the photoresist pattern as a mask to form a wire grid pattern;
 providing a planarizing protecting film on the wire grid pattern; and
 providing a switching element array on the planarizing protecting film to manufacture the display substrate.

10. The method of claim 9, wherein the reflective layer comprises a metal layer and a protective layer on the metal layer.

11. The method of claim 10, wherein the metal layer comprises at least one selected from nickel, aluminum, titanium, silver and chrome.

12. The method of claim 10, wherein the protective layer includes at least one selected from a silicon nitride and a silicon oxide.

13. The method of claim 9, wherein the mono-functional monomer includes at least one selected glycidyl acrylate, glycidyl methacrylate, hydroxyethyl methacrylate, 2-hydroxy-3-phenoxy-propyl acrylate, diethylene methylether methacrylate, hydroxyethyl acrylate, butyl methacrylate, hydroxypropyl acrylate, 2-phenoxyethyl acrylate, 2-phenoxyethyl methacrylate, 3,3,5-trimethylcyclohexyl methacrylate, isobornyl acrylate, isobornyl methacrylate, isodecyl acrylate, isodecyl methacrylate, isooctyl acrylate, lauryl acrylate, stearyl acrylate, tetrahydrofurfuryl acrylate and tridecyl acrylate, wherein the di-functional monomer includes at least one selected from 1,6-hexanediol diacrylate, 1,6-hexanediol dimethacrylate, ethyleneglycol dimethacrylate, diethylene dimethacrylate, 1,1,2-dodecanediol dimethacrylate, 1,4-butanediol dimethacrylate, neopentylglycol diacrylate, diethylene diacrylate, dipropyleneglycol diacrylate, bisphenol A diacrylate, bisphenol A dimethacrylate, ethyleneglycol diacrylate, tetraethyleneglycol diacrylate, tricyclodecanedimethanol diacrylate and triethyleneglycol diacrylate, and wherein the multi-functional monomer includes at least one selected from pentaerythritol triacrylate, pentaerythritol tetraacrylate, trimethylpropane triacrylate, trimethylpropane trimethacrylate, triacrylate, tri(2-hydroxyethyl) isocyanurate triacrylate, di-trimethylpropane tetraacrylate, dipentaerythritol pentaacrylate and pentaerythritol tetraacrylate.

14. A method of manufacturing a display substrate, the method comprising:
 providing a reflective layer on a first surface of a base substrate;
 coating a photoresist composition on the reflective layer to form a photoresist coating layer, the photoresist composition comprising
  about 65 percent by weight to about 80 percent by weight of a mono-functional monomer;
  about 5 percent by weight to about 20 percent by weight of a di-functional monomer;
  about 1 percent by weight to about 10 percent by weight of a multi-functional monomer comprising three or more functional groups;
  about 1 percent by weight to about 5 percent by weight of a photoinitiator; and
  less than about 1 percent by weight of a surfactant, each based on a total weight of the photoresist composition;
 contacting the photoresist coating layer with a stamp having a wire grid shape to pattern the photoresist coating layer;
 curing the patterned photoresist coating layer to form a photoresist pattern having the wire grid shape;
 removing the stamp from the photoresist pattern having the wire grid shape;
 etching the reflective layer using the photoresist pattern as a mask to form a wire grid pattern;

providing a planarizing protecting film on the wire grid pattern; and providing a switching element array on a second surface opposite to the first surface of the base substrate to manufacture the display substrate.

* * * * *